United States Patent [19]
Hegeler

[11] Patent Number: 6,151,489
[45] Date of Patent: Nov. 21, 2000

[54] PROCESS FOR PROVIDING A CONTROL, SIGNAL FOR CONTROLLING A RADIO RECEIVER AFTER A CHANGE IN POSITION

[75] Inventor: Wilhelm Hegeler, Hildesheim, Germany

[73] Assignee: Robert Bosch GmbH, Stuttgart, Germany

[21] Appl. No.: 09/011,359

[22] PCT Filed: Jun. 3, 1997

[86] PCT No.: PCT/DE97/01112

§ 371 Date: Feb. 4, 1998

§ 102(e) Date: Feb. 4, 1998

[87] PCT Pub. No.: WO97/47086

PCT Pub. Date: Dec. 11, 1997

[30] Foreign Application Priority Data

Jun. 4, 1996 [DE] Germany .......................... 196 22 349

[51] Int. Cl.[7] .................................................. H04B 1/18
[52] U.S. Cl. .................................... 455/226.2; 455/226.1
[58] Field of Search .................................... 455/456, 457, 455/224, 226.1, 226.2, 186.1, 186.2, 45

[56] References Cited

U.S. PATENT DOCUMENTS

| | | | |
|---|---|---|---|
| 4,112,421 | 9/1978 | Freeny, Jr. | 455/456 |
| 4,989,263 | 1/1991 | Suzuki | 455/226.1 |
| 5,390,234 | 2/1995 | Bar-Noy et al. | 379/59 |
| 5,393,713 | 2/1995 | Schwob | 455/186.1 |
| 5,428,827 | 6/1995 | Kasser | 455/186.1 |
| 5,734,981 | 3/1998 | Kennedy, III et al. | 455/456 |

FOREIGN PATENT DOCUMENTS

| | | |
|---|---|---|
| 0092055 | 10/1983 | European Pat. Off. . |
| 0479613 | 10/1991 | European Pat. Off. . |
| 2104744 | 6/1982 | United Kingdom . |

*Primary Examiner*—Edward F. Urban
*Attorney, Agent, or Firm*—Kenyon & Kenyon

[57] ABSTRACT

A method of supplying a control signal for controlling a radio receiver after a change in location. Four check-back transmit frequencies are stored in the radio receiver. The control signal is supplied by a counter whose count is increased regularly or is reduced by a factor when there is a change in the check-back transmit frequencies.

7 Claims, 2 Drawing Sheets

PROCESS FOR PROVIDING A CONTROL SIGNAL FOR CONTROLLING A RADIO RECEIVER AFTER A CHANGE IN POSITION

FIELD OF THE INVENTION

The present invention relates to a method of supplying a control signal for controlling a radio receiver after a location change and a radio receiver for carrying out this method.

BACKGROUND INFORMATION

It is known that with program-controlled radio receivers it is possible to search for the transmit frequency with the best reception at the given location.

The reception quality of a transmit frequency is known to depend on the distance between the location of the transmitter and that of the receiver. If this distance is increased, transmitter reception quality may be lost.

If various transmit frequencies stored in a radio receiver can be activated by freely selecting one via the actuator, then it is also beneficial to know whether the distance between the transmitter and receiver has changed significantly between two successive operating times at the same transmit frequency, i.e., whether there has been a significant change in location of the receiver in the meantime. Frequent and significant changes in location can be expected with car radios in particular.

SUMMARY OF THE INVENTION

The method according to the present invention is capable of supplying a control signal containing information about a change in location of a radio receiver.

DETAILED DESCRIPTION

Figure 1:
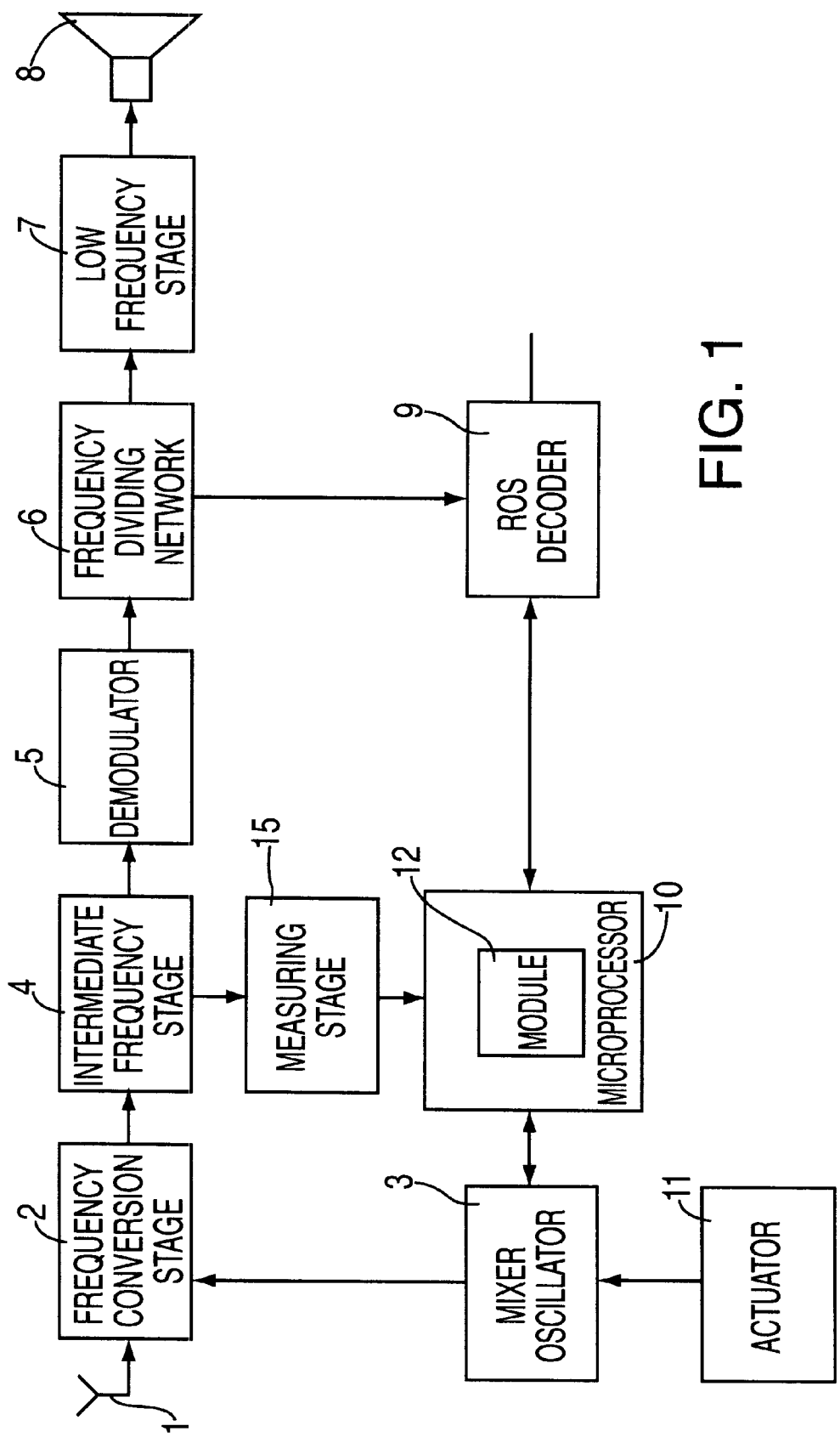
FIG. 1 shows a block diagram of an exemplary program controlled radio receiver equipped to carry out the method of the present invention.

The radio receiver shown as a block diagram in FIG. 1 receives the entire spectrum of transmit frequencies via an antenna 1. In a frequency conversion stage 2, a mixed frequency generated in mixer oscillator 3 is superimposed on the antenna signal. This yields an intermediate frequency modulated with the MPX signal of a certain transmit frequency. This intermediate frequency is amplified in an intermediate frequency stage 4. Then the MPX signal is separated from the intermediate frequency in a demodulator 5 and passes through a frequency dividing network 6. A low frequency stage 7 connected to one of the outputs of frequency dividing network 6 supplies a speaker 8 which renders the program set by selection of the mixed frequency audible.

RDS decoder 9 connected to a second output of frequency dividing network 6 separates RDS signals in the MPX signal from a 57 kHz auxiliary carrier and makes the various RDS signals available at assigned outputs.

Decoding of RDS signals in RDS decoder 9 is controlled by a first subprogram of microprocessor 10.

A second subprogram of microprocessor 10 controls the respective setting of mixer oscillator 3, which can also be freely varied by the operator via actuator 11. For example, the desired program is selected or a search operation (best, search, travel) is initiated with this actuator.

A third subprogram of microprocessor 10 controls the method of supplying a control signal for controlling the radio receiver when there is a significant change in location of the radio receiver.

Figure 2:
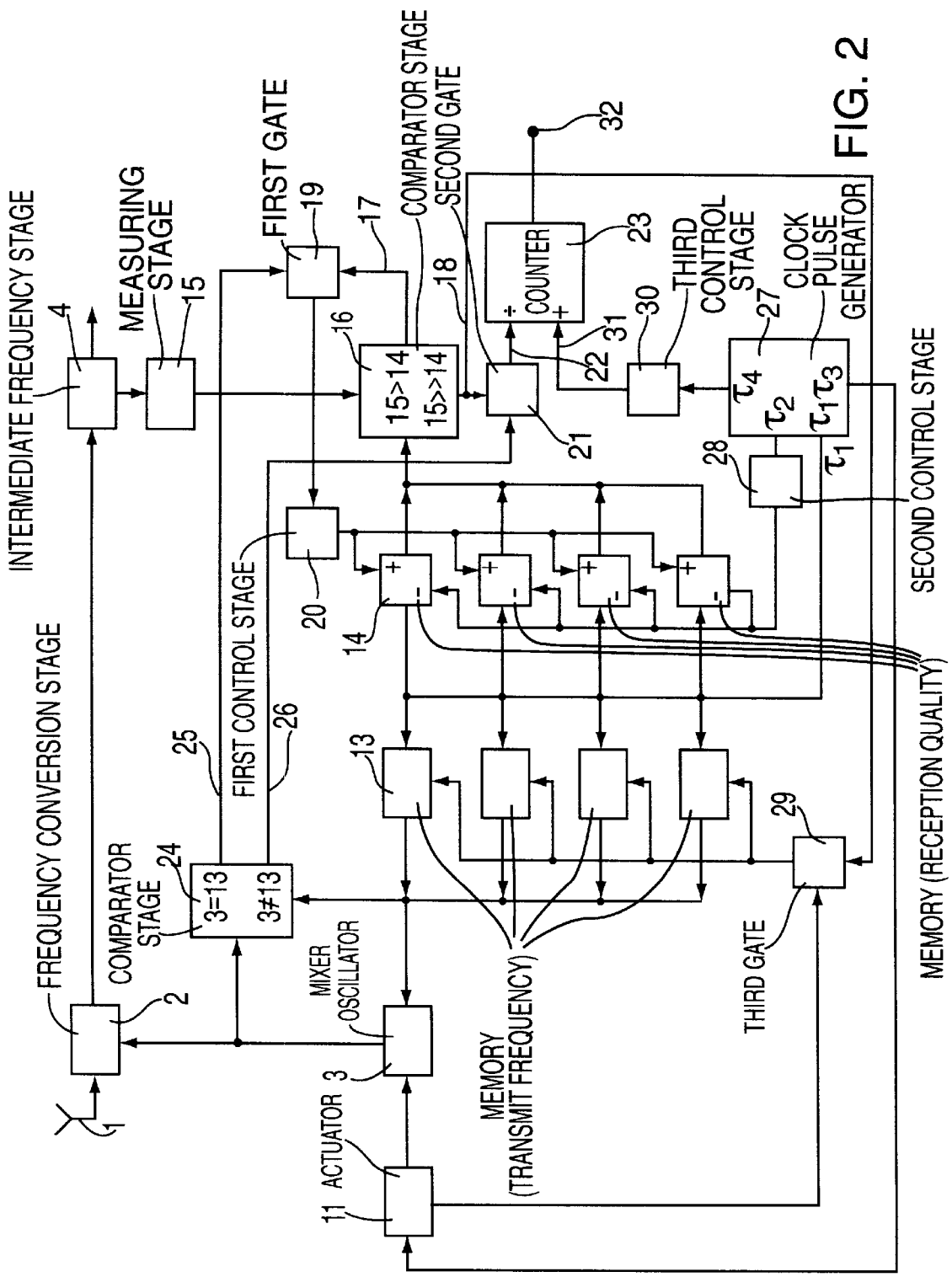
FIG. 2 shows a block diagram of an exemplary microprocessor design for carrying out the method of the present invention.

To carry out this method, the radio receiver has a module 12, whose design is shown in detail in FIG. 2. Module 12 may be integrated into microprocessor 10 or it may be a component of actuator 11.

Module 12 connected to mixer oscillator 3 comprises four separate memories 13 for four transmit frequencies and four assigned memories 14 for the reception quality of these transmit frequencies when set in mixer oscillator 3. This reception quality, determined on the basis of reception field strength in the simplest case, is measured in a measuring stage 15 connected to intermediate frequency stage 4. The four stored transmit frequencies serve as check-back transmit frequencies.

Module 12 includes a first comparator stage 16 in which the value of the reception quality stored in memories 14 can be compared with the instantaneous measurement results of measuring stage 15. Comparator stage 16 has two evaluation states, the first of which displays at output 17 a measured value which is larger than the stored value, and the second of which displays at output 18 a measured value which is significantly higher, e.g. by 30 dB$\mu$V, than the stored value.

Output 17 is connected via a first gate 19 to a first control stage 20, and output 18 is connected via a second gate 21 to input 22 of counter 23.

Both gates 19 and 21 are controlled by two different outputs of a second comparator stage 24. A control signal can be picked up at output 25 of comparator stage 24 when the transmit frequency set by mixer oscillator 3 corresponds to the check-back transmit frequency stored in memory 13 ($3 \approx 13$). A signal appears at output 26 of comparator stage 24 when the set transmit frequency is a non-check-back transmit frequency ($3 \neq 13$).

Occasionally ($n \times \tau_1$) the four check-back transmit frequencies are set in succession by a clock pulse generator 27 ($3 \approx 13$) regardless of whether one of the check-back transmit frequencies or one of the non-check-back transmit frequencies is being rendered audible at the moment. The instantaneous reception quality is measured here and compared with the reception quality of the set check-back transmit frequencies stored in memory 14. If the instantaneous reception quality is better than the stored reception quality, then this better value is entered into assigned memory 14, i.e. the stored value is upgraded, via gate 19 and first control stage 20.

Between two runs testing the reception quality of the check-back transmit frequencies, i.e., at times $n \times \tau_1$, the values present in memories 14 are simultaneously decreased by an amount preset in a second control stage 28, likewise under the control of clock pulse generator 27. In other words, the values stored in memories 14 are continuously downgraded over a long period of time. After several downgrading steps, the reception quality of a check-back transmit frequency with almost uniform reception quality is saved anew because the reception quality received proves to be better than the downgraded stored value.

At predetermined intervals $\tau_3$ which are also controlled by clock pulse generator 27, also the reception quality of the transmit frequency (set via actuator 11) of the program selected is compared in comparator stage 16 with the values stored in memories 14 ($3 \neq 13$). If this value proves to be much larger than one of the values stored in memories 14, then the non-check-back transmit frequency of the program selected, which is set via actuator 11, is replaced with the previously saved check-back transmit frequency by output 18 of comparator stage 16 via a third gate 29.

The same thing happens when a new strong transmit frequency is found during a search.

With the same signal, the count on counter 23 is reduced, for example, by a factor of ½, via the second gate 21.

In between, at times $n \times \tau_4$ the count on counter 23 is regularly increased by a relatively small amount, which is preselected in the third control stage 30, via input 31.

The control signal containing information about the change in location is available at output 32 of counter 23.

This is based on the following considerations which are illustrated on the basis of the situation where an automotive radio is installed in a motor vehicle traveling over flat terrain. However, the same considerations can also apply to any mobile wireless receiver.

A certain transmit frequency spectrum can be received at the initial location of the vehicle and in its immediate vicinity. Let us assume that four transmit frequencies from this spectrum with their evaluation are stored in the four memories 13 and 14 when the car radio is turned on. Occasionally, e.g., at intervals of $\tau_1 = 12$ minutes, the reception quality of the four check-back transmit frequencies is reviewed. At the initial location and its immediate vicinity, the evaluation, which has been devalued in the meantime, is usually upgraded again because reception quality there has not changed significantly.

However, if the car radio moves farther away from its initial location, the reception quality of one or more check-back transmit frequencies can be expected to deteriorate, and the evaluation is not upgraded again in the review.

During the entire duration of the trip, the count on counter 23 is incremented continuously at intervals $\tau_4$.

At longer predetermined intervals $\tau_3$ the evaluation of the check-back transmit frequencies is compared as mentioned above with the evaluation of the transmit frequency of the set program or the transmit frequency found in the search. If the evaluation of the latter shows a much better field strength, e.g. by 30 dB$\mu$V, than one of the check-back transmit frequencies, i.e., at least the weakest check-back transmit frequency, then the weakest check-back transmit frequency is replaced with the stronger non-check-back transmit frequency, as explained above. In this exchange, the count on counter 23 is also reduced, e.g., by a factor of ½.

As a rule, an increasing distance of the vehicle from its initial location can be deduced from this new low count.

The greater the distance, the more check-back transmit frequencies are replaced with new transmit frequencies, with the count on counter 23 being reduced each time. In other words, the reduction in count, the deviation from its maximum, represents information, i.e., a control signal regarding a change in location of the car radio. If the vehicle having the car radio then remains at the new location for a certain period of time, there is no longer any change in check-back transmit frequencies, and counter 23 can be incremented by the predetermined amount in an undisturbed manner, e.g., every 12 minutes.

An increase in count or reaching the maximum thus provides information about the vehicle remaining at one location or in its close proximity for a long period of time. Remaining for a long period of time at a new location establishes a "new" initial location, also called "home."

There is often a loss of field strength in the vicinity of high-rise buildings or in mountainous regions, despite the fact that the car radio has not moved a great distance from its "home". This circumstance can be taken into account either through the choice of intervals for reviewing the check-back transmit frequency or by reducing the count only after repeatedly ascertaining the conditions for a change in the check-back transmit frequency.

The blocks shown in the drawing represent certain functions that can be implemented in carrying out the methods described here.

They can also be implemented through suitable command structures in the microprocessor program and do not represent any restriction on the invention.

What is claimed is:

1. A method of supplying a control signal for controlling a radio receiver after a change in location, comprising the steps of:

evaluating a check-back transmit frequency for determining whether the check-back transmit frequency is of a reception quality;

storing the check-back transmit frequency in the radio receiver if it is determined that the check-back transmit frequency is of the reception quality;

comparing the reception quality of the stored check-back transmit frequency with a reception quality of a set non-check-back transmit frequency;

replacing the stored check-back transmit frequency with the non-check-back transmit frequency if the reception quality of the non-check-back transmit frequency is greater by a first predetermined value than the reception quality of the stored check-back transmit frequency;

incrementing a count by a second predetermined value at a predetermined interval;

reducing the count by a predetermined factor when the stored check-back transmit frequency is replaced by the non-check-back transmit frequency; and supplying the control signal as a function of the count.

2. The method according to claim 1, further comprising the step of replacing the non-check back transmit frequency with a lowest-valued stored reception quality check-back transmit frequency when the reception quality of the non-check-back transmit frequency is evaluated as greater than the reception quality of the stored check-back transmit frequency.

3. The method according to claim 1, further comprising the steps of:

reevaluating the reception quality of the check-back transmit frequency at a predetermined interval;

replacing the stored check-back transmit frequency with the reevaluated check-back transmit frequency if the reception quality of the reevaluated check-back transmit frequency is greater than the reception quality of the stored check-back transmit frequency; and downgrading the reception quality of the check-back transmit frequency by a predetermined amount between reevaluation intervals.

4. The method according to claim 1, wherein the control signal is supplied only upon an occurrence of a predetermined deviation of the count from a maximum count.

5. The method according to claim 1, wherein the predetermined factor for reducing the count is ½.

6. The method according to claim 1, wherein four check-back transmit frequencies are stored.

7. A radio receiver for supplying a control signal after a change in location of the radio receiver, the control signal containing information with respect to the change in location, the radio receiver comprising:

a first memory for storing check-back transmit frequencies;

a second memory for storing at least one value indicative of a reception quality of the check-back transmit frequencies stored in the first memory;

a counter for generating a count-dependent output signal; and a microprocessor for supplying the control signal and containing a subprogram for controlling the count-dependent output signal as a function of a change in a status of the check-back transmit frequencies, wherein:

the counter is capable of being incremented by a first predetermined value at a predetermined interval, and the counter is capable of being decremented by a predetermined factor when one of the stored check-back transmit frequencies is replaced by a non-check-back transmit frequency.

* * * * *